(12) United States Patent
Brink

(10) Patent No.: US 6,353,911 B1
(45) Date of Patent: Mar. 5, 2002

(54) ITERATIVE DEMAPPING

(75) Inventor: Stephan Ten Brink, Baden-Württemberg (DE)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/285,580

(22) Filed: Apr. 2, 1999

(30) Foreign Application Priority Data

Apr. 3, 1998 (EP) ............................................. 98302653

(51) Int. Cl.[7] ............................................. H03M 13/00
(52) U.S. Cl. ....................................................... 714/780
(58) Field of Search ................................ 714/780, 786, 714/788

(56) References Cited

FOREIGN PATENT DOCUMENTS

| EP | 96111310.7 | 7/1996 | .......... H03M/13/00 |
| FR | 95 01603 | 2/1995 | ............. H04L/1/22 |
| JP | 10-107761 A | * 4/1998 | ............. H04J/11/00 |

OTHER PUBLICATIONS

Le Goff et al "Turbo–Codes And High Spectral Efficiency Modulation" "Supercom ICC May 1–5, 1994 New Orleans" pp. 645–649.

G. Bauch et al "Iterative Equalization And Decoding In Mobile Communications Systems" "EPMCC Sep. 30, 1997 Bonn, Germany" pp. 307–312.

European Search Report dated Jul. 27, 1998.

* cited by examiner

*Primary Examiner*—Albert Decady
*Assistant Examiner*—Shelly A Chase
(74) *Attorney, Agent, or Firm*—Richard J. Botos

(57) ABSTRACT

A method and apparatus for iteratively decoding a multilevel modulated signal in which the soft output information of a channel decoder is fed back and utilized by a tailored soft demapping device in order to improve the decoding result by further iterative decoding steps. The receiver includes a demapper for generating a demapped signal, bit deinterleaver for generating a demapped and deinterleaved signal and a decoder for generating soft reliability values representative of the decoded signal. These soft reliability values are then bit interleaved and fed back to the demapper, as a priori knowledge, for use in further iterations of the decoding process.

5 Claims, 4 Drawing Sheets

ITERATIVE DEMAPPING

CROSS REFERENCES

This application claims priority of European Patent Application No. 98302653.5, which was filed on Apr. 03, 1998

BACKGROUND OF THE INVENTION

1. Field of the Invention

This invention relates to iterative decoding of signals in a receiver e.g. a base station in a digital wireless communication system.

2. Description of Related Art

Iterative decoding algorithms have become a vital field of research in digital communications. The first discovered and still most popular encoding scheme suited for iterative decoding is the parallel concatenation of two recursive systematic convolutional codes, also referred to as "Turbo Codes". The underlying "Turbo Principle" is applicable more generally to other algorithms used in modern digital communications, and in the past few years, other applications of the "Turbo Principle" have been found.

Channel coding is used to make the transmitted digital information signal more robust against noise. For this the information bit sequence gets encoded at the transmitter by a channel encoder and decoded at the receiver by a channel decoder. In the encoder redundant information is added to the information bit sequence in order to facilitate error correction in the decoder. For example, in a systematic channel encoding scheme the redundant information is added to the information bit sequence as additional, inserted "coded" bits. In a non-systematic encoding scheme the outgoing bits are ail coded bits, and there are no longer any "naked" information bits. The number of incoming bits (information bits) at the encoder is smaller than the number of outgoing bits (information bits plus inserted coded bits, or ail coded bits). The ratio of incoming/outgoing bits is called the "code rate R" (typically R=1:2).

Recent improvements using the "Turbo Principle" have shown that, in digital communication systems involving a plurality of users in wireless communication with a receiver, an improvement in the quality of the decoded signal can be achieved by applying iterative decoding steps to the received data. In particular, "Iterative Equalization and Decoding in Mobile Communication Systems" by Baunch, Khorram and Hagenauer, EPMCC '97, pp 307–312, October 1997, Bonn, Germany, discusses the application of the Turbo principle to iterative decoding of coded data transmitted over a mobile radio channel.

In order to be suitable for iterative decoding, a transmitted signal must be encoded by at least two concatenated codes, either serially or parallelly concatenated.

FIG. 1 shows a serially concatenated coding scheme: the transmission is done on a block-by-block basis. The binary signal from the digital source gets encoded firstly by an outer encoder and is then passed through an interleaver, which changes the order of the incoming bit symbols to make the signal appear more random to the following processing stages. After the interleaver, the signal gets encoded a second time by an "inner encoder". Correspondingly, at the receiver the signal gets first decoded by the inner decoder in a first decoding step, deinterleaved, and decoded by the outer decoder in a second decoding step. From the outer decoder soft decision values are fed back as additional "a priori" input to the inner decoder. The soft decision values provide information on the reliability of the hard decision values. In a first iteration the decoding step is repeated and the soft decision values are used as input values for the first and second decoder.

The iterative decoding of a particular transmitted sequence is stopped with an arbitrary termination criterion, e.g. after a fixed number of iterations, or until a certain bit error rate is reached. It should be noted that the "a priori" soft value input to the inner decoder is set to zero for the very first decoding of the transmitted bit sequence ("0 th iteration").

The inner and outer binary codes can be of any type: systematic, or nonsystematic, block or convolutional codes. Simple mapping (e.g. antipodal or binary phase shift keying) is performed in the transmitter (after the inner encoder) and simple demapping is performed in the receiver (after the inner decoder) although for clarity this is not shown in FIG. 1. Likewise, FIG. 1 illustrates a single user scenario, although application of appropriate multiplexing provides a suitable multi user system.

At the receiver the two decoders are soft-in/soft-out decoders (SISO decoder). A soft value represents the reliability on the bit decision of the respective bit symbol (whether 0 or 1 was sent). A soft-in decoder accepts soft reliability values for the incoming bit symbols. A soft-out decoder provides soft reliability output values on the outgoing bit symbols. The soft-out reliability values are usually more accurate than the soft-in reliability values since they are improved during the decoding process, based on the redundant information added with each encoding step at the transmitter. The best performance is achieved by a SISO-decoder which provides the A Posteriori Probability calculator (APP), tailored to the respective channel code. Several faster, but suboptimal algorithms exist, e.g. the SOVA (soft output Viterbi algorithm).

In the particular application of a mobile communication system, the channel encoder and the intersymbol interference (ISI) channel may be viewed as a serially concatenated encoding scheme, with the channel encoder acting as the outer encoder and the ISI-channel acting as an inner, rate 1, time-varying convolution encoder. Thus, iterative decoding is suitable for application, in particular, to the European Wireless Digital Cellular Standard "GSM" with the equalizer performing the inner decoding step and the decoder providing the outer decoding step. Where bad communication channel conditions (low SNR, fading, multipath propagation, etc.) exist, an improvement in the Bit Error Rate (BER) may be achieved with each iterative decoding step until a BER floor is reached. The signal received by a base station is equalized to provide soft decision values of the received coded bits.

Repeating the decoding step several times can improve the BER of the received signal. However, each iterative decoding step consumes resources, such as memory, computation time and ties up dedicated ASICs (Application Specific Integrated Circuits). In a practical base station, the number of signals that can be decoded in parallel is limited by the number of signal processing units (SPU) available; providing iterative decoding hardware, such as digital signal processors (DSPs), and software to each SPU adds considerably to the cost and complexity of the base station.

In multilevel modulation, N bits (bit symbols) are grouped together at the transmitter to form one "mapped symbol" (also briefly referred to as "symbol"). This symbol can be mapped onto a real or a complex signal space (i.e. real axis, or complex plane). The mapping operation simply associates the unmapped symbol (N bits, value from 0, ..., $2^N-1$) with a discrete amplitude level for Pulse Amplitude Modulation (PAM), a discrete phase level for Phase Shift Keying (PSK), any discrete signal point in the complex plane for Quadrature Amplitude Modulation (QAM) or any combination of PAM, QAM, PSK. Typically a Gray-Code mapping is used in which case adjacent signal points differ by exactly one binary digit. In general the mapping can be of any type.

At the receiver the incoming symbols are noise affected. The hard decision demapping operation associates the incoming symbol with the closest signal point in the signal space (signal point with minimum Euclidean distance in real or complex signal space) and takes for example the respective Gray-encoded codeword as the hard decision values (0,1) for the N bits per mapped symbol.

However, if multilevel modulation is used in conjunction with channel coding and soft channel decoding (i.e. a soft input decoder) the demapping operation preferably calculates soft reliability values as inputs to the channel decoder. For simplicity, "multilevel modulation" is used when referring to PAM, PSK and QAM modulation, meaning "multi-amplitude level" for PAM, "multi phase level" for PSK and "multi signal points" for QAM.

SUMMARY OF THE INVENTION

According to a first aspect of the invention there is provided a method of iteratively decoding a signal comprising the steps of: demapping the signal; and decoding the demapped signal and characterized in that the demapping step and the decoding step are iterated and further characterized in that the iterated demapping step uses, as an input, the output of the previous decoding step.

According to a second aspect of the invention there is provided apparatus for iteratively decoding a signal comprising: a demapper, having a first input for receiving the signal and an output, for generating a demapped signal; a decoder, having an input for receiving the demapped signal and an output for generating a decoded signal; and characterized in that the demapper has a second input for receiving the decoded signal.

BRIEF DESCRIPTION OF THE DRAWINGS

An embodiment of the invention is described below, using by way of example a mobile cellular communication system, and with reference to the following figures, in which.

DETAILED DESCRIPTION

Figure 1:
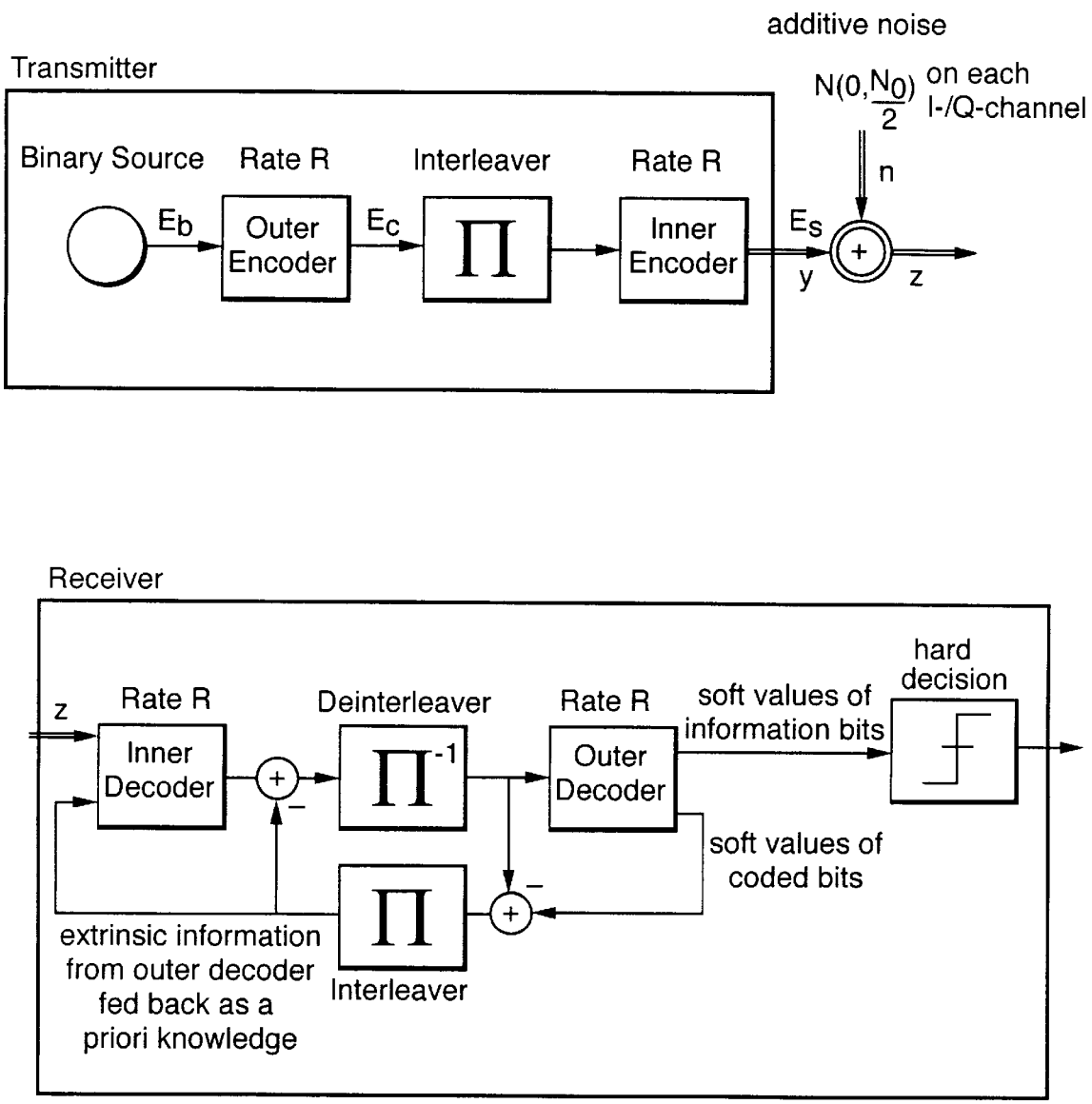
FIG. 1 shows a transmitter and receiver using a serially concatenated coding scheme.

Each user in a mobile communication system may have a different Quality of Service (QoS) requirement, i.e. different BER and latency constraints due to differing communication services. For example: voice communication has the lowest BER requirements (i.e. can tolerate many bit errors) with the highest latency constraints (i.e. cannot tolerate long delays in two way conversation); visual communication has a higher BER requirement and high latency constraints; data communication (e.g. wireless Internet web-browsing) has the highest BER requirements and the lowest latency constraints. Each user communicates with the base station with a different signal quality (i.e. SNR), multipath propagation and fading due to differing distance from the base station, propagation environment and, if mobile, speed.

The mapping operation itself does not add redundancy (in contrast to the inner encoder in "classic" serially concatenated encoding schemes) to the signal, but adds memory to the signal by grouping several bit symbols to form one mapped symbol.

The demapper is a soft demapping device that has been modified in order to accept a priori information obtained from the decoder. The decoder is a channel decoder and can be any SISO-decoder (optimal APP, or other sub-optimal algorithm, e.g. SOVA). The iterative demapping and decoding can thus be regarded as a serially concatenated iterative decoding scheme whereby the inner decoder is replaced by the soft demapping device. The iterative demapping and decoding is stopped by an arbitrary termination criterion (e.g. after a fixed number of iterations, or when a certain bit error rate is reached).

At the transmitter, the binary random signal gets convolutionally encoded and fed to an interleaver which interleaves the bit symbols. (Any channel code can be used, non-systematic convolutional codes are used merely as an example). After the interleaver, N bits are grouped together and mapped onto a complex signal constellation according to the applied modulation scheme (PAM, PSK, QAM as illustrated in FIGS. 3 to 6, in which I-channel stands for real part, Q-channel for imaginary part of the signal). The preferred codeword assignment (also referred to as 'mapping') is Gray-encoding as shown in FIGS. 3 to 6, whereby neighboring signal points differ by only one binary digit. Gray-encoding is used merely as an example and any other mapping, such as Anti-Gray-encoding may be used.

In the channel, the symbols get distorted by additive noise or any other noise form.

At the receiver the channel symbols get demapped and ungrouped by a log-likelihood ratio calculation for each of the N Gray-encoded bits per symbol. The log-likelihood ratio values ("soft values") are deinterleaved and put into the A Posteriori Probability calculator (APP). (Any other SISO-decoder may be used). After the decoding the estimates on the transmitted information bits are available at the output of the hard decision device by taking the sign of the APP-soft output values for the information bits.

In the iterative demapping/decoding path the "extrinsic information" is passed through the bit interleaver and fed back as a priori knowledge to the soft demapping device. The "extrinsic" information is the difference between the soft input and the soft output value at the decoder, and depicts the new, statistically independent information (at least for the first iteration) gained by the decoding process.

The complex channel symbol z at the receiver can be considered as a matched filter output. It carries N encoded bits. Since the SISO-decoder has soft input processing, the demapping device extracts a soft value for each bit $x_0, \ldots, x_{N-1}$, for further decoding in the SISO-decoder. This soft value for each of the N bits per symbol is the log-likelihood ratio (L-value) of the respective bit conditioned on the matched filter output z. The absolute value of the L-value denotes the reliability of the bit decision.

The full term of the L-value calculation for bit $x_k$ consists of an additive "a priori" L-value for bit $x_k$ and a fractional term in which the a priori L-values of the remaining, bits $x_{j,j}=0 \ldots N-1, j \neq k$ are included.

The a priori L-values of bits $x_0, \ldots, x_{N-1}$ are provided by the SISO decoder as inputs to the soft demapping device.

Figure 2:
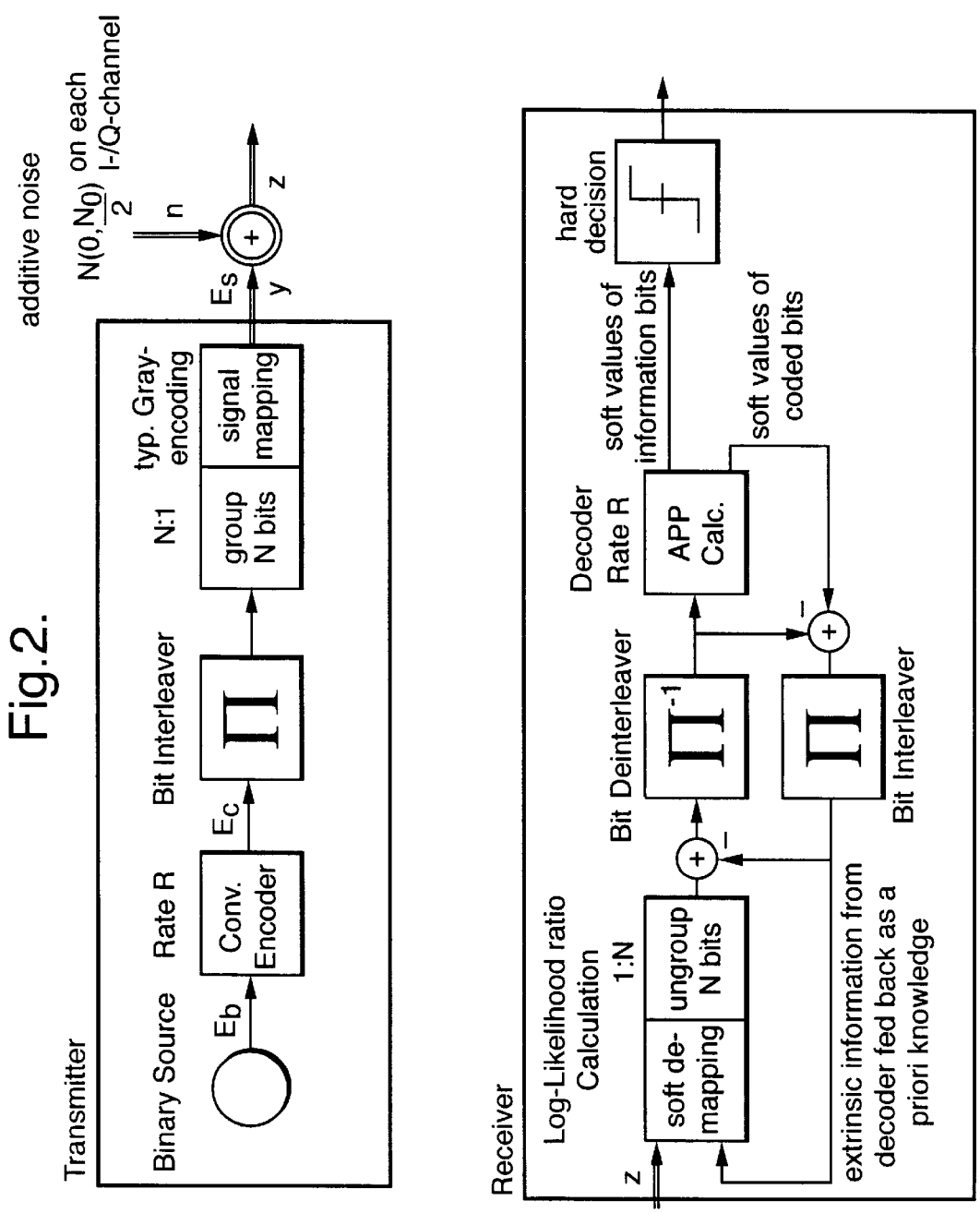
FIG. 2 shows a transmitter and receiver system according to the invention.
Figure 3:
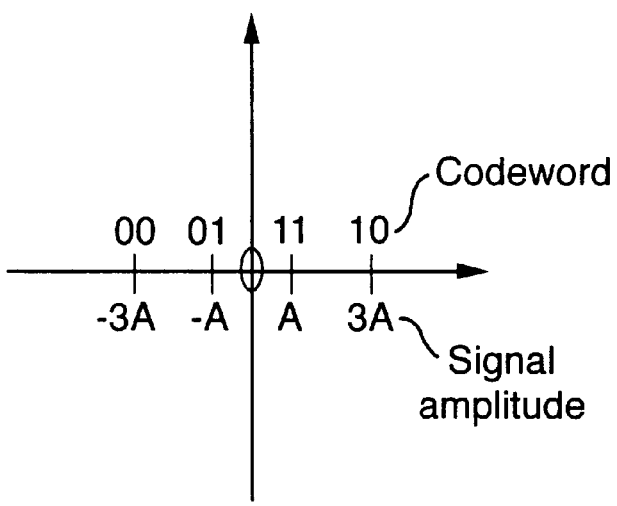
FIG. 3 shows a signal constellation for 4-level PAM scheme.
Figure 4:
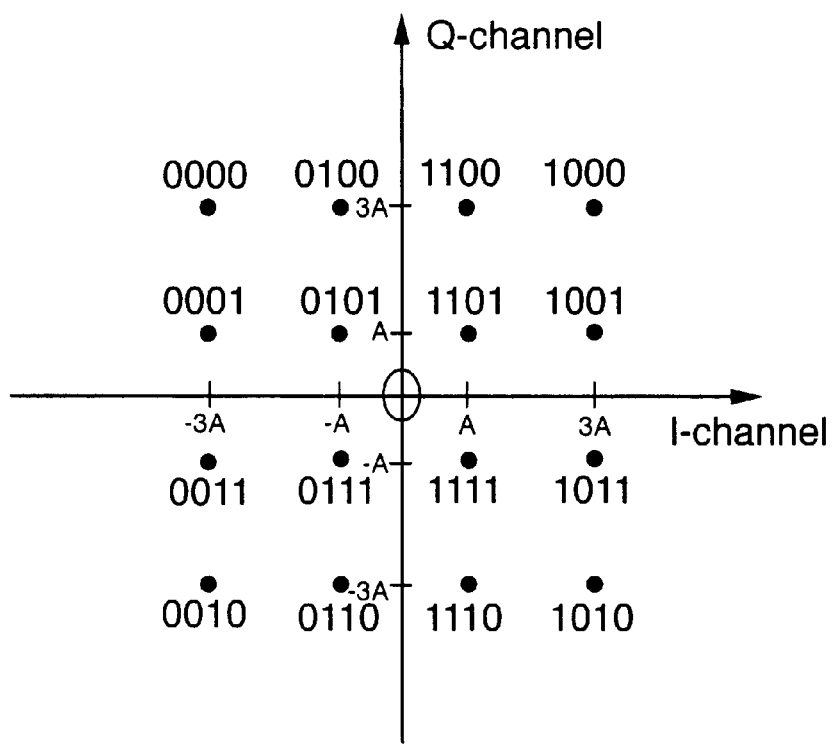
FIG. 4 shows a signal constellation for rectangular 16-point QAM in complex signal space.
Figure 5:
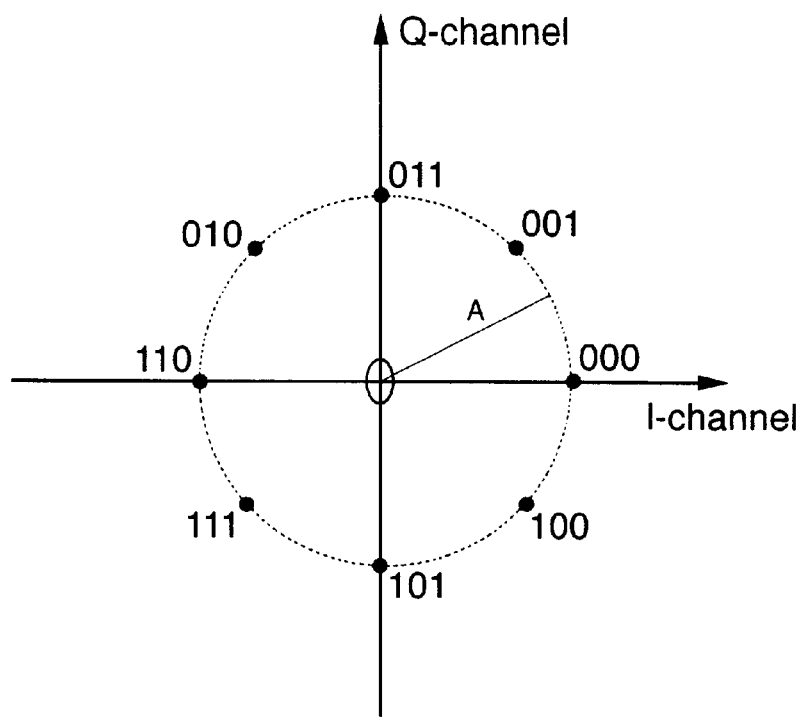
FIG. 5 shows a signal constellation for 8-level PSK in the complex signal space.
Figure 6:
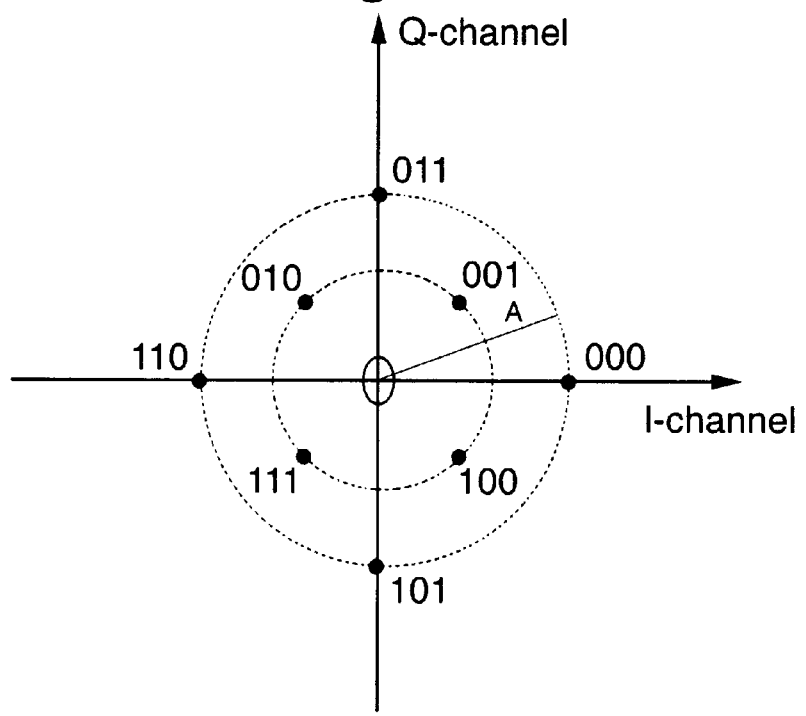
FIG. 6 shows a signal constellation for an arbitrary combination PAM, PSK, rectangular QAM, also referred to as QAM.

Simulations show that the best performance of iterative soft demapping and decoding is achieved if the additive a priori L-value for bit $x_k$ is left out of the full term of the L-value for bit $x_k$, and if the a priori L-values of the remaining bits $x_{j,j}=0 \ldots N-1, j \neq k$ are considered in the calculation of the L-value for bit $x_k$. This is indicated in FIG. 2 by the subtraction after the demapping device: the a priori values coming from the SISO-decoder are subtracted from the output of the log-likelihood ration calculation of the respective bit in the demapping device. The information that is fed to the deinterleaver can thus be regarded as the "extrinsic information" of the demapping device (in contrast to the extrinsic information from the SISO-decoder).

Note the L-value calculation implies both, soft demapping and ungrouping of the N bits per symbol (not two separate operations, as FIG. 2 might suggest).

Iterative soft demapping and decoding reduces the bit error rate of conventional multilevel modulation schemes that use plain channel coding. Many modern digital communications systems, with simple channel coding and multilevel modulation, may be improved by altering the receiver circuitry to include a soft demapping device that accepts a priori information, and a SISO-decoder as channel decoder.

It is applicable to multilevel modulation schemes with N bits per symbol, whereby N>1 for PAM, PSK and QAM, whereby for PSK and QAM with N=2 AntiGray-mapping has to be applied.

It is important to note that the interleaver is a bit symbol interleaver, which interleaves the symbol on the bit level. Providing there is at least one bit symbol interleaver between encoder and mapper, other systems that apply both bit symbol and "n bit" symbol interleavers in a serial concatenation between encoder and symbol mapper may be employed.

I claim:

1. A method of iteratively decoding a multilevel modulated signal comprising the steps of:

demapping the signal;

bit deinterleaving the demapped signal;

decoding the deinterleaved signal;

interleaving the output of the decoding step; and iterating the demapping step, the deinterleaving step and the decoding step, the iterated demapping step using, as an input, the bit interleaved output of the previous decoding step, wherein the decoding step produces soft reliability values representative of the decoded signal, and wherein the iterated demapping steps accept the bit interleaved soft reliability values produced by the decoding step.

2. The method of claim 1 wherein the demapping, deinterleaving and decoding steps are iterated until a predetermined bit error rate is achieved.

3. A method as in any of the preceding claims in which the signal is AntiGray encoded.

4. Apparatus for iteratively decoding a multilevel modulated signal comprising:

a demapper, having a first input for receiving the signal and an output for generating a signal;

a bit deinterleaver, having an input for receiving the demapped signal and an output, for generating a demapped and deinterleaved signal;

a decoder, having an input for receiving the deinterleaved signal and an output for generating a decoded signal; and a bit interleaver, having an input for receiving the decoded signal and an output, for generating a bit deinterleaved decoded signal;

wherein the demapper has a second input for receiving the bit interleaved decoded signal and wherein the decoder produces soft reliability values representative of the decoded signal.

5. Apparatus of claim 4 further comprising a demultiplexer for demultiplexing multiplexed signals, having an output connected to the demapper.

* * * * *